(12) United States Patent
Tomioka

(10) Patent No.: US 10,654,178 B2
(45) Date of Patent: May 19, 2020

(54) OPTICAL SIGNAL TRANSMITTER HAVING A PENETRATING METAL CONNECTOR BETWEEN A LIGHT SOURCE AND A HEAT DISSIPATER

(71) Applicant: Seiko Epson Corporation, Tokyo (JP)

(72) Inventor: Hiroto Tomioka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/273,287

(22) Filed: Feb. 12, 2019

(65) Prior Publication Data

US 2019/0248029 A1 Aug. 15, 2019

(30) Foreign Application Priority Data

Feb. 13, 2018 (JP) .................................. 2018-022830

(51) Int. Cl.
| | |
|---|---|
| G06F 15/00 | (2006.01) |
| G06F 3/12 | (2006.01) |
| G06K 1/00 | (2006.01) |
| B25J 19/02 | (2006.01) |
| F21V 8/00 | (2006.01) |
| B41J 2/447 | (2006.01) |
| B41J 29/393 | (2006.01) |

(52) U.S. Cl.
CPC ............. *B25J 19/025* (2013.01); *B41J 2/447* (2013.01); *B41J 29/393* (2013.01); *G02B 6/0066* (2013.01)

(58) Field of Classification Search
CPC ........ B25J 19/025; B41J 2/447; B41J 29/393; G02B 6/0066
USPC ................................... 358/1.15, 1.1
See application file for complete search history.

(56) References Cited

U.S. PATENT DOCUMENTS

| | | | |
|---|---|---|---|
| 6,490,392 B1 | 12/2002 | Munekata et al. | |
| 2014/0133799 A1* | 5/2014 | Yasuda | G02B 6/4214 385/14 |
| 2019/0129113 A1* | 5/2019 | Moriyama | G02B 6/4281 |

FOREIGN PATENT DOCUMENTS

JP 2000-292656 A 10/2000

* cited by examiner

*Primary Examiner* — Douglas Q Tran
(74) *Attorney, Agent, or Firm* — Harness, Dickey & Pierce, P.L.C.

(57) ABSTRACT

A robot has an optical signal transmitter that transmits an optical signal, the optical signal transmitter includes a light source, a supporting board that supports the light source, and a light guide part that transmits light emitted from the light source, and the supporting board includes a board main body, a penetration portion connected to the light source, penetrating in a thickness direction of the board main body, and formed using a metal material, and a heat dissipation portion connected to the penetration portion and formed using a metal material, wherein the penetration portion is placed between the light source and the heat dissipation portion, and the light source is placed between the light guide part and the supporting board.

10 Claims, 13 Drawing Sheets

OPTICAL SIGNAL TRANSMITTER HAVING A PENETRATING METAL CONNECTOR BETWEEN A LIGHT SOURCE AND A HEAT DISSIPATER

BACKGROUND

1. Technical Field

The present invention relates to a robot, printer, and optical signal transmitter.

2. Related Art

An optical signal transmitter disclosed in Patent Document 1 (JP-A-2000-292656) has a substrate in which a through hole is formed, a housing placed on the downside of the substrate and closing a lower opening of the through hole, a light emitting device placed within the through hole, and an optical waveguide placed on the upside of the substrate and propagating light emitted from the light emitting device. In the configuration, heat of the light emitting device is released to outside via the housing.

However, in the optical signal transmitter of Patent Document 1, as described above, it is difficult to reduce the height because the heat of the light emitting device is released to outside via the housing.

SUMMARY

A robot according to an aspect of the invention includes an optical signal transmitter that transmits an optical signal, the optical signal transmitter includes a light source, a supporting board that supports the light source, and a light guide part that transmits light emitted from the light source, and the supporting board includes a board main body, a penetration portion connected to the light source, penetrating in a thickness direction of the board main body, and formed using a metal material, and a heat dissipation portion connected to the penetration portion and formed using a metal material, wherein the penetration portion is placed between the light source and the heat dissipation portion, and the light source is placed between the light guide part and the supporting board.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a robot, printer, optical signal transmitter according to the invention will be explained in detail based on embodiments shown in the accompanying drawings.

First Embodiment

First, a robot according to the first embodiment of the invention is explained.

Figure 1:
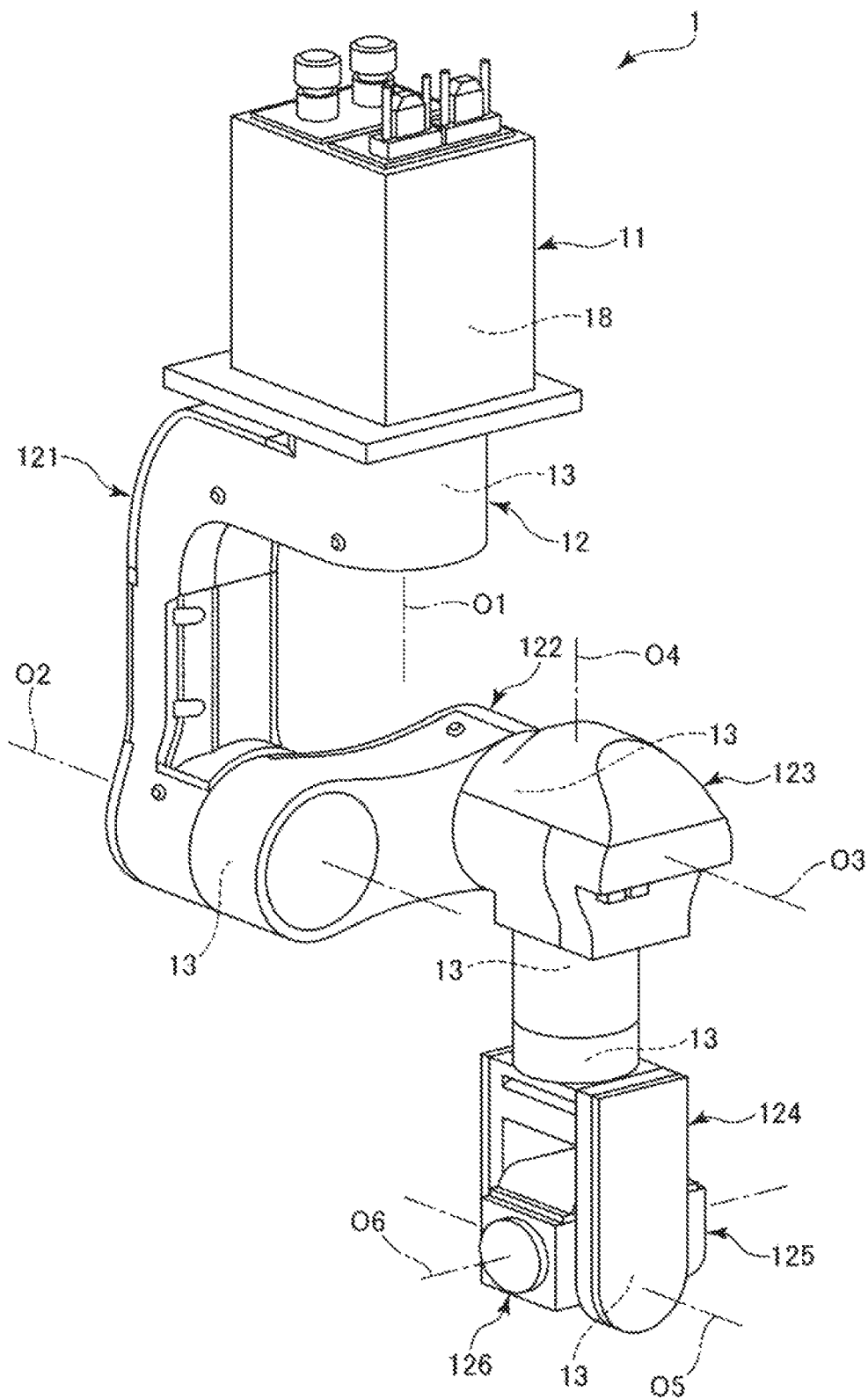
FIG. 1 is a perspective view showing a robot according to a first embodiment of the invention.
Figure 2:
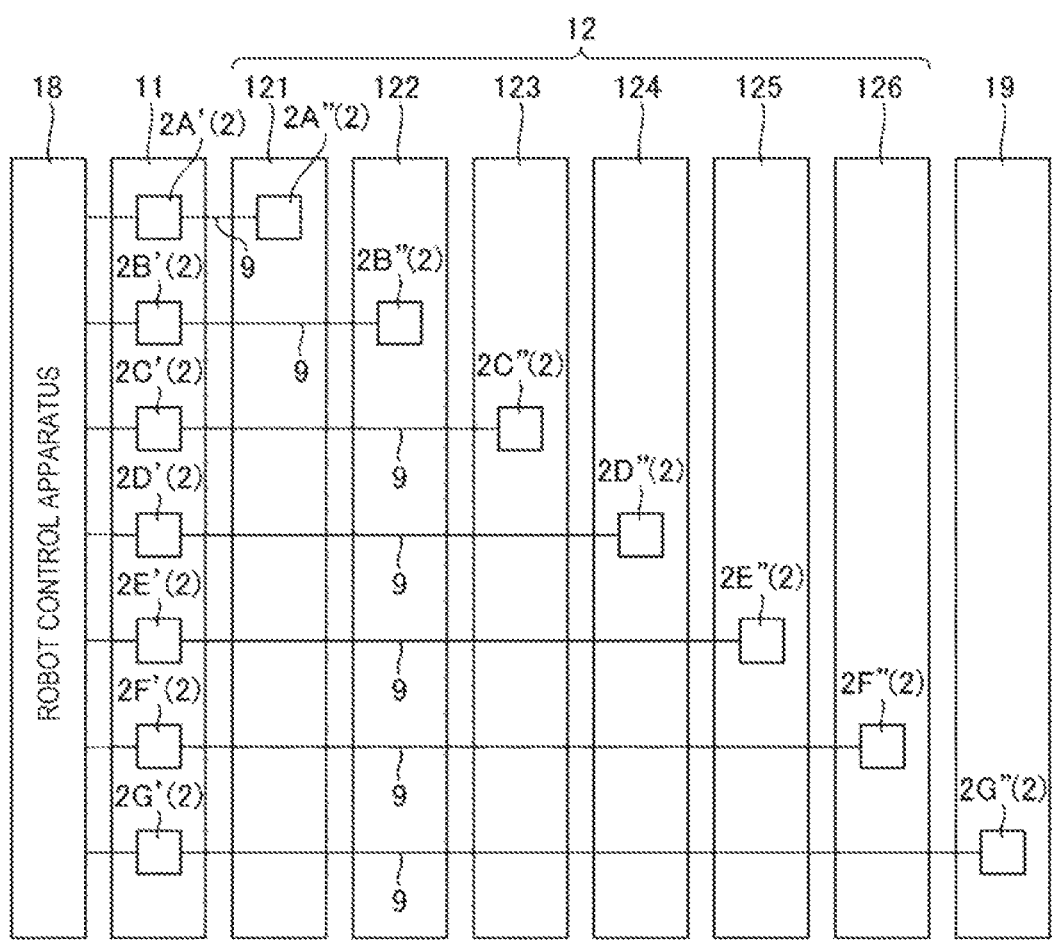
FIG. 2 shows an arrangement of optical signal transmitters of the robot shown in FIG. 1.
Figure 3:
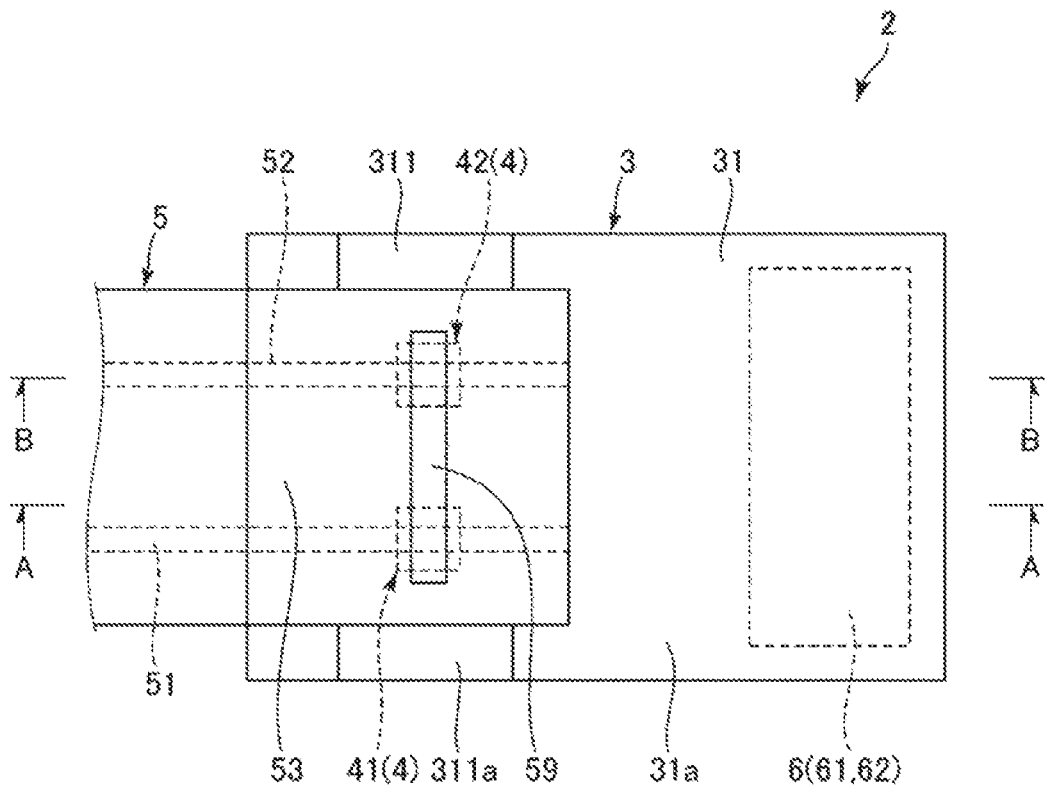
FIG. 3 is a top view showing the optical signal transmitter.
Figure 4:
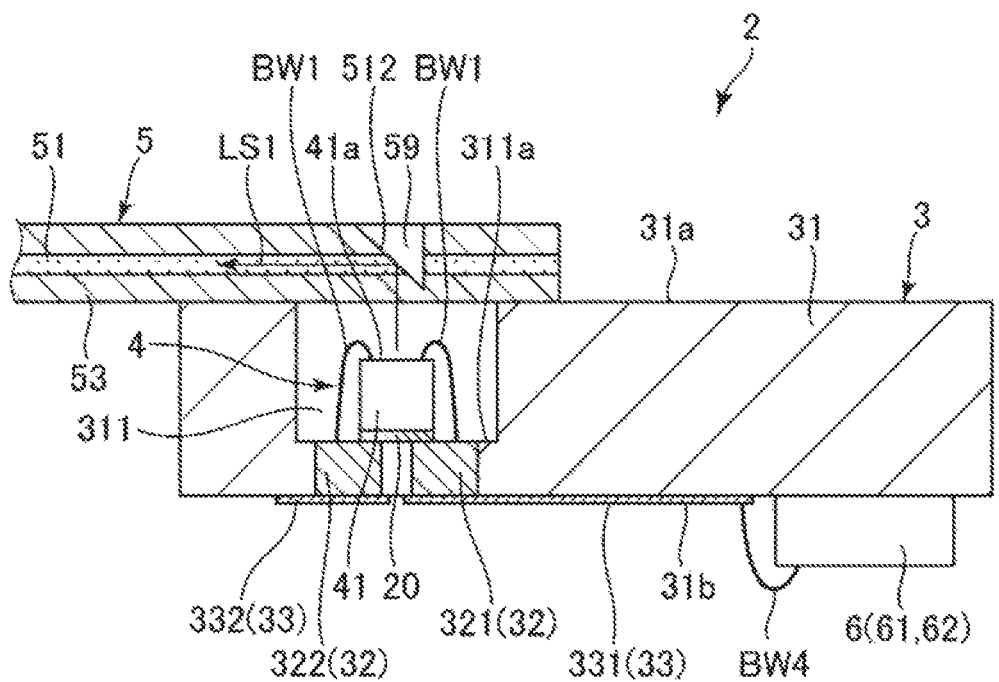
FIG. 4 is a sectional view along line A-A in FIG. 3.
Figure 5:
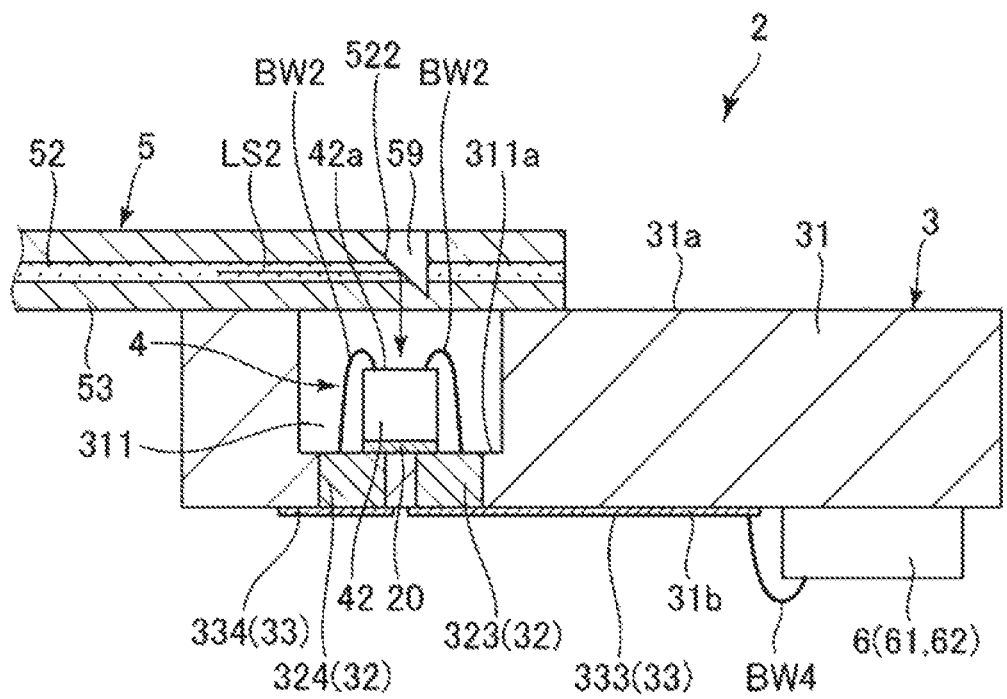
FIG. 5 is a sectional view along line B-B in FIG. 3.
Figure 6:
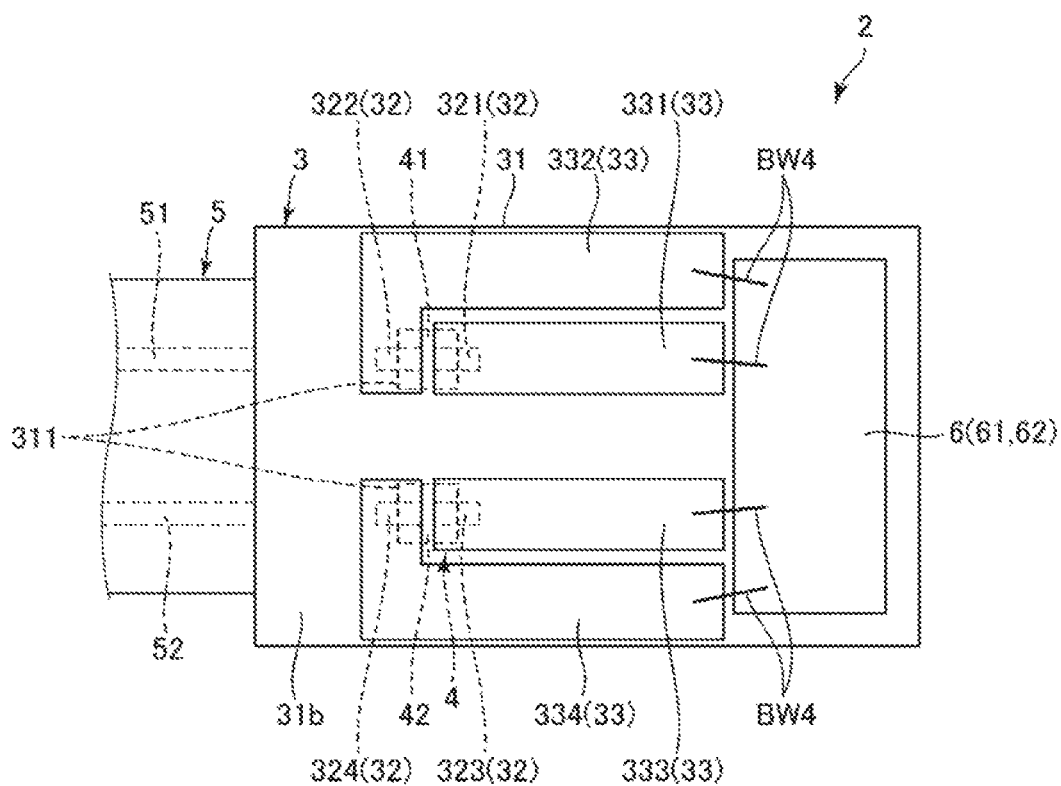
FIG. 6 is a bottom view showing the optical signal transmitter.
Figure 7:
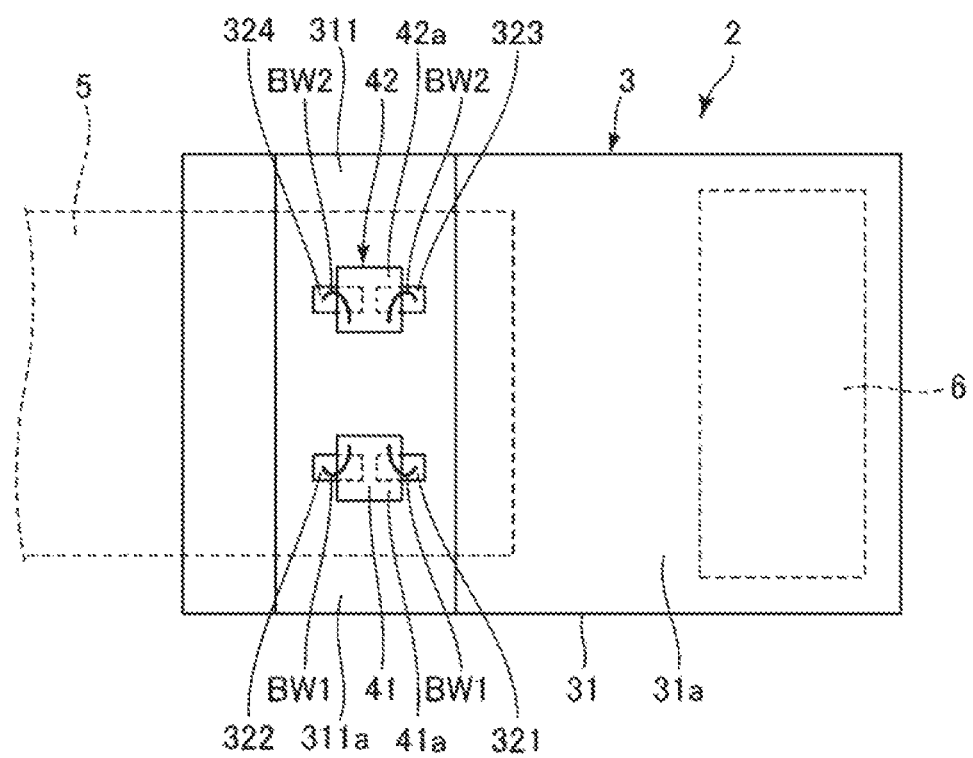
FIG. 7 is a top view showing the optical signal transmitter without illustration of a light guide part.

FIG. 1 is a perspective view showing a robot according to the first embodiment of the invention. FIG. 2 shows an arrangement of optical signal transmitters of the robot shown in FIG. 1. FIG. 3 is a top view showing the optical signal transmitter. FIG. 4 is a sectional view along line A-A in FIG. 3. FIG. 5 is a sectional view along line B-B in FIG. 3. FIG. 6 is a bottom view showing the optical signal transmitter. FIG. 7 is a top view showing the optical signal transmitter without illustration of a light guide part. Hereinafter, for convenience of explanation, the near side of the paper in FIG. 3 is also referred to as "upper" and the far side of the paper is also referred to as "lower".

A robot 1 shown in FIG. 1 may perform work of e.g. feeding, removing, carrying, assembly, etc. of precision apparatuses and components forming the apparatuses. Note that the usage of the robot 1 is not limited to that.

The robot 1 is a vertical articulated (six-axis) robot. The robot 1 has a base 11 and a robot arm 12. The robot arm 12 has a first arm 121, a second arm 122, a third arm 123, a fourth arm 124, a fifth arm 125, and a sixth arm 126.

The base 11 is fixed to e.g. a floor, wall, ceiling, or the like. The first arm 121 is rotatable about a first rotation axis O1 with respect to the base 11. The second arm 122 is rotatable about a second rotation axis O2 orthogonal to the first rotation axis O1 with respect to the first arm 121. The third arm 123 is rotatable about a third rotation axis O3 parallel to the second rotation axis O2 with respect to the second arm 122. The fourth arm 124 is rotatable about a fourth rotation axis O4 orthogonal to the third rotation axis O3 with respect to the third arm 123. The fifth arm 125 is rotatable about a fifth rotation axis O5 orthogonal to the fourth rotation axis O4 with respect to the fourth arm 124. The sixth arm 126 is rotatable about a sixth rotation axis O6 orthogonal to the fifth rotation axis O5 with respect to the fifth arm 125. Regarding the first rotation axis O1 to sixth rotation axis O6, "orthogonal" includes the case where an angle formed by two axes is within a range of ±5° from 90°. Further, "parallel" includes the case where one of two axes tilts relative to the other within a range of ±5°.

Further, in the robot 1, an end effector such as a robot hand 19 (not shown in FIG. 1) that grasps e.g. a precision apparatus, component, or the like may be detachably attached to the distal end part of the sixth arm 126. The robot 1 includes a robot control apparatus 18 such as a personal computer that controls operation of the respective parts of the robot 1. The robot 1 includes driving apparatuses 13 placed in the respective coupling parts (joints) of the base 11 and the first arm 121 to sixth arm 126. Each driving apparatus 13 includes e.g. a motor as a drive source of the arm, a controller that controls driving of the motor, a reducer, an encoder, etc.

As shown in FIG. 2, the robot 1 has a plurality of optical signal transmitters 2 placed inside. Specifically, the plurality of optical signal transmitters 2 include optical signal transmitters 2A', 2B', 2C', 2D', 2E', 2F', 2G', which are placed within the base 11, and an optical signal transmitter 2A" placed within the first arm 121 and optically connected to the optical signal transmitter 2A' via an optical interconnection 9, an optical signal transmitter 2B" placed within the second arm 122 and optically connected to the optical signal transmitter 2B' via an optical interconnection 9, an optical signal transmitter 2C" placed within the third arm 123 and optically connected to the optical signal transmitter 2C' via an optical interconnection 9, an optical signal transmitter 2D" placed within the fourth arm 124 and optically connected to the optical signal transmitter 2D' via an optical interconnection 9, an optical signal transmitter 2E" placed within the fifth arm 125 and optically connected to the optical signal transmitter 2E' via an optical interconnection 9, an optical signal transmitter 2F" placed within the sixth arm 126 and optically connected to the optical signal transmitter 2F' via an optical interconnection 9, and an optical signal transmitter 2G" placed within the robot hand 19 and optically connected to the optical signal transmitter 2G' via an optical interconnection 9.

Note that it is only necessary that the robot 1 has at least one optical signal transmitter 2 and, for example, part of the optical signal transmitters 2A', 2A", 2B', 2B", 2C", 2C', 2D', 2D", 2E', 2E", 2F', 2F", 2G', 2G" (hereinafter, for convenience of explanation, also referred to as "optical signal transmitters 2A' to 2G"") may be omitted. Or, the optical signal transmitters 2 may be placed to be exposed outside of the robot 1, not within the robot 1. The optical signal transmitters 2A' to 2G" have the same configuration as one another and, as below, these will be collectively explained as the optical signal transmitter 2.

The optical signal transmitter 2 has a function of transmitting and receiving optical signals. As shown in FIG. 3, the optical signal transmitter 2 has a supporting board 3, a photoelectrical conversion part 4, a light guide part 5, and a circuit element 6. Further, as shown in FIGS. 4 and 5, the supporting board 3 has a board main body 31, four penetration portions 32 (321, 322, 323, 324) penetrating the board main body 31 in the thickness direction, and four heat dissipation portions 33 (331, 332, 333, 334) provided on the lower surface of the board main body 31. As the supporting board 3, e.g. various flexible wiring boards, various rigid printed wiring boards, etc. may be used.

The board main body 31 has two principal surfaces, and one principal surface is an upper surface 31a and the other principal surface is a lower surface 31b. Further, in the board main body 31, a concave portion 311 with a bottom opening to the upper surface 31a is provided. In other words, the upper surface 31a has the concave portion 311 with the bottom. In the embodiment, both ends of the concave portion 311 open toward both sides (both ends in the width direction) of the board main body 31 (see FIG. 7), however, are not limited to that. For example, both ends of the concave portion 311 may be closed. The board main body 31 may be hard or flexible and may be used differently according to the intended use. Note that the constituent material of the board main body 31 is not particularly limited, but e.g. various resin materials, various ceramic materials, various glass materials, etc. may be used, or combinations of the materials may be used.

The four penetration portions 321 to 324 are provided through a bottom surface 311a of the concave portion 311 and the lower surface 31b of the board main body 31. That is, the upper ends of the penetration portions 321 to 324 face the bottom surface 311a and the lower ends face the lower surface 31b. Further, as shown in FIG. 6, the four heat dissipation portions 331 to 334 (heat sinks) are provided apart and insulated from one another on the lower surface 31b of the board main body 31. The heat dissipation portion 331 is electrically connected to the penetration portion 321, the heat dissipation portion 332 is electrically connected to the penetration portion 322, the heat dissipation portion 333 is electrically connected to the penetration portion 323, and the heat dissipation portion 334 is electrically connected to the penetration portion 324.

The respective penetration portions 32 and the respective heat dissipation portions 33 are formed using metal materials and have sufficiently high electrical conductivity and thermal conductivity. As will be described later, these respective penetration portions 32 and respective heat dissipation portions 33 are electrically and thermally connected to the photoelectrical conversion part 4, and function as wires of the photoelectrical conversion part 4 and function as heat dissipation portions that dissipate the heat of the photoelectrical conversion part 4 to outside. Note that having "sufficiently high electrical conductivity" refers to having e.g. electrical conductivity equal to or higher than $1 \times 10^7$ S/m, and having "sufficiently high thermal conductivity" refers to having e.g. thermal conductivity equal to or higher than 50 W/mk.

The constituent materials of the respective penetration portions 32 and the respective heat dissipation portions 33 are not particularly limited, but may be e.g. various metals including iron, nickel, cobalt, gold, platinum, silver, copper, manganese, aluminum, magnesium, zinc, led, tin, titanium, and tungsten, or alloys, intermetallic compounds, or the like containing at least one of the metals. Here, "penetration portions 32 (heat dissipation portions 33) formed using metal materials" refer to portions using metal materials as main materials, portions containing other materials than the metal materials and, more specifically, penetration portions 32 (heat dissipation portions 33) containing the metal materials at 90% by mass or more (preferably 95% by mass or more).

The photoelectrical conversion part 4 has a function of generating a first optical signal LS1 converted from an electrical signal and a function of receiving and converting a second optical signal LS2 into an electrical signal. As shown in FIGS. 4 and 5, the photoelectrical conversion part 4 has a light emitting device 41 and a light receiving device 42. The first optical signal LS1 is generated using light emitted from the light emitting device 41 and the second optical signal LS2 received by the light receiving device 42 is converted into an electrical signal.

The light emitting device 41 and the light receiving device 42 are respectively held within the convex portion 311 and joined to the bottom surface 311a of the concave portion 311 via an insulating joining member 20 such as an adhesive. As described above, the concave portion 311 is provided in the supporting board 3 and the photoelectrical conversion part 4 is held within the concave portion 311, and thereby, the height of the optical signal transmitter 2 may be reduced. Note that, for example, the concave portion 311 may be filled with a transparent sealing material to seal the light emitting device 41 and the light receiving device 42. Thereby, the light emitting device 41 and the light receiving device 42 may be protected from dust and moisture.

A light emitting surface 41*a* of the light emitting device 41 and a light receiving surface 42*a* of the light receiving device 42 respectively face upward (toward the opening of the concave portion 311). The light emitting device 41 is not particularly limited as long as the device can emit light. For example, an LD, surface emitting laser (VCSEL), LED, or the like may be used. The light receiving device 42 is not particularly limited as long as the device can output a current signal according to the received light. For example, a photodiode (FD) may be used.

As shown in FIG. 7, in the plan view of the supporting board 3, the penetration portions 321, 322 are placed to overlap with the light emitting device 41. As described above, the penetration portions 321, 322 overlap with the light emitting device 41, and therefore, the penetration portions 321, 322 and the light emitting device 41 are thermally connected, and the heat generated from the light emitting device 41 is transferred to the heat dissipation portions 331, 332 via the penetration portions 321, 322 and released to outside in the heat dissipation portions 331, 332. Thereby, an excessive temperature rise of the light emitting device 41 may be suppressed and reduction of light emission efficiency (light intensity) of the light emitting device 41 due to the temperature rise may be suppressed. Accordingly, the bit error of the first optical signal LS1 may be reduced.

Further, the penetration portions 321, 322 are respectively electrically connected to the light emitting device 41 via bonding wires BW1. Accordingly, the light emitting device 41 is electrically led to outside of the concave portion 311 via the penetration portions 321, 322 and the heat dissipation portions 331, 332. Therefore, the electrical connection between the circuit element 6 and the light emitting device 41 is easier.

As described above, the penetration portions 321, 322 and the heat dissipation portions 331, 332 have a function of releasing the heat of the light emitting device 41 to outside and serve as lead wires of the light emitting device 41. Particularly, in the embodiment, part of the penetration portions 321, 322 is exposed from the light emitting device 41 in the plan view, and the connection of the bonding wires BW1 to the penetration portions 321, 322 is easier. Note that the electrical connection method between the light emitting device 41 and the penetration portions 321, 322 is not limited to the method using the bonding wires BW1.

In the plan view of the supporting board 3, the penetration portions 323, 324 are placed to overlap with the light receiving device 42. As described above, the penetration portions 323, 324 overlap with the light receiving device 42, and therefore, the penetration portions 323, 324 and the light receiving device 42 are thermally connected, and the heat generated from the light receiving device 42 is transferred to the heat dissipation portions 333, 334 via the penetration portions 323, 324 and released to outside in the heat dissipation portions 333, 334. Thereby, an excessive temperature rise of the light receiving device 42 may be suppressed and reduction of light reception characteristics may be suppressed. Accordingly, the electrical signal may be generated from the second optical signal LS2 with higher accuracy.

Further, the penetration portions 323, 324 are respectively electrically connected to the light receiving device 42 via bonding wires BW2. Accordingly, the light receiving device 42 is electrically led to outside of the concave portion 311 via the penetration portions 323, 324 and the heat dissipation portions 333, 334. Therefore, the electrical connection between the circuit element 6 and the light receiving device 42 is easier.

As described above, the penetration portions 323, 324 and the heat dissipation portions 333, 334 have a function of releasing the heat of the light receiving device 42 to outside and serve as lead wires of the light receiving device 42. Particularly, in the embodiment, part of the penetration portions 323, 324 is exposed from the light receiving device 42 in the plan view, and the connection of the bonding wires BW2 to the penetration portions 323, 324 is easier. Note that the electrical connection method between the light receiving device 42 and the penetration portions 323, 324 is not limited to the method using the bonding wires BW2.

As described above, the light emitting device 41 and the light receiving device 42 are joined to the bottom surface 311*a* of the concave portion 311 via the joining member 20. Accordingly, the heat of the light emitting device 41 is transferred to the penetration portions 321, 322 via the joining member 20 and the heat of the light receiving device 42 is transferred to the penetration portions 323, 324 via the joining member 20. Therefore, in view of the efficient heat transfer, it is preferable to use a member having higher thermal conductivity as the joining member 20.

Here, in the embodiment, the joining member 20 having the insulation property is used to prevent conduction of the penetration portions 321, 322 via the joining member 20. However, for example, in the case where conduction of the penetration portions 321, 322 via the joining member 20 may be prevented by division into a part in contact with the penetration portion 321 and a part in contact with the penetration portion 322, an electrically conductive joining member 20 may be used.

For example, a metallic joining member of solder, gold (Au) braze, silver (Ag) braze, copper (Cu) braze, or the like is used as the electrically conductive joining member 20, and thereby, a joining member 20 having sufficiently high thermal conductivity is obtained. Therefore, the heat of the light emitting device 41 may be transferred to the penetration portions 321, 322 via the joining member 20 more efficiently. The same applies to the joining member 20 that joins the light receiving device 42 to the bottom surface 311*a*.

As shown in FIGS. 4 and 5, the light guide part 5 is joined (connected) to the upper surface 31*a* of the board main body 31 via a joining member (not shown) so that the photoelectrical conversion part 4 may be located between the supporting board 3 and itself, and optically connected to the photoelectrical conversion part 4. As described above, the light guide part 5 is placed on the side of the upper surface 31*a* of the board main body 31, and thereby, the heat dissipation portions 33 may be placed on the lower surface 31*b* of the board main body 31 without the light guide part 5 getting in the way. Further, the heat dissipation portions 33 may be placed in a wider range, and the heat dissipation properties of the heat dissipation portions 33 may be improved.

The circuit element 6 is placed on the lower surface of the supporting board 3. Further, the circuit element 6 is electrically connected to the heat dissipation portions 331 to 334 via bonding wires BW4. Thereby, the circuit element 6 is electrically connected to the light emitting device 41 via the heat dissipation portions 331, 332 and the penetration portions 321, 322 and electrically connected to the light receiving device 42 via the heat dissipation portions 333, 334 and the penetration portions 323, 324.

The circuit element 6 has e.g. a first circuit 61 for the light emitting device 41 and a second circuit 62 for the light receiving device 42. The first circuit 61 includes e.g. an LDD circuit for switching the current to the light emitting device 41. On the other hand, the second circuit 62 includes e.g. a trance impedance amplifier (TIA), and may impedance-convert and amplify the current signal output by the light receiving device 42 and output the signal as a voltage signal. Note that the circuit element 6 is not particularly limited. Or, the circuit element 6 may be omitted. Or, the circuit element 6 may be placed on the upper surface 31a of the board main body 31 and electrically connected to the heat dissipation portions 331 to 334 via through electrodes formed in the board main body 31.

An electronic component electrically connected to the optical signal transmitter 2 via the circuit element 6 is not particularly limited. For example, for the optical signal transmitters 2A' to 2G', the robot control apparatus 18 is the electronic component and, for the optical signal transmitters 2A" to 2G", the driving apparatus 13 is the electronic component. In this case, one of the first optical signal LS1 and the second optical signal LS2 is used as a signal (control signal) transmitted from the robot control apparatus 18 to the controller of the driving apparatus 13, and the other is used as an output signal transmitted from the encoder of the driving apparatus 13 to the robot control apparatus 18. Thereby, the communication speed between the robot control apparatus 18 and the driving apparatus 13 may be made higher.

Note that, not limited to that, but e.g. the optical signal transmitters 2A" to 2G" may be electrically connected to various sensors including cameras, force sensors, temperature sensors, and pressure sensors (not shown) placed in the robot 1. In this case, one of the first optical signal LS1 and the second optical signal LS2 may be used as a signal (control signal) transmitted from the robot control apparatus 18 to the sensor, and the other is used as an output signal transmitted from the sensor to the robot control apparatus 18. Thereby, the the communication speed between the robot control apparatus 18 and the sensor may be made higher. Further, the optical signal transmitters 2A" to 2G" may be connected to both the driving apparatuses 13 and the sensors and, in this case, the signals may be time-divisionally transmitted and received using multiplexers or the like.

As shown in FIGS. 4 and 5, the light guide part 5 has a plate shape and the distal end portion is located on the photoelectrical conversion part 4. The light guide part 5 has an optical transmission line 51 for propagating the first optical signal LS1, an optical transmission line 52 for propagating the second optical signal LS2, and a base portion 53 that covers the optical transmission lines 51, 52. The light guide part 5 may be a polymer optical waveguide (organic optical waveguide) formed using polymer or inorganic optical waveguide formed using glass.

The optical transmission line 51 has a higher refractive index than the base portion 53. Accordingly, the first optical signal LS1 entering the optical transmission line 51 propagates while being totally reflected and confined in the optical transmission line 51. Similarly, the optical transmission line 52 also has a higher refractive index than the base portion 53. Accordingly, the second optical signal LS2 entering the optical transmission line 52 propagates while being totally reflected and confined in the optical transmission line 52.

Further, the optical transmission line 51 has a part opposed to the light emission surface 41a of the light emitting device 41, and a reflection portion 512 that reflects and guides the light (first optical signal LS1) emitted from the light emitting device 41 to the optical transmission line 51 is formed in the part. Similarly, the optical transmission line 52 has a part opposed to the light receiving surface 42a of the light receiving device 42, and a reflection portion 522 that reflects the light (second optical signal LS2) propagating in the optical transmission line 52 toward the light receiving surface 42a of the light receiving device 42 is formed in the part.

The constituent materials of the optical transmission lines 51, 52 and the base portion 53 are not particularly limited as long as the refractive indexes of the optical transmission lines 51, 52 are larger than the refractive index of the base portion 53 as described above, but e.g. various resin materials including cyclic ether resin such as acrylic resin, methacrylic resin, polycarbonate, polystyrene, epoxy resin, and oxetane resin, polyamide, polyimide, polybenzoxazole, polysilane, polysilazane, silicone resin, fluorocarbon resin, polyurethane, polyolefin resin, polybutadiene, polyisoprene, polychloroprene, polyester including PET and PBT, polyethylenesuccinate, polysulfone, polyether, and cyclic olefin resin including benzocyclobutene and norbornene resin, various glass materials such as quartz glass and borosilicate glass, etc., and composite materials formed by combination of at least two different materials may be used.

The configurations of the reflection portions 512, 522 are not particularly limited as long as the configurations may reflect light. In the embodiment, as shown in FIGS. 4 and 5, a notch 59 reaching the optical transmission lines 51, 52 from the upper surface of the light guide part 5 is formed and the inclined surfaces formed by the notch 59 are used as the reflection portions 512, 522. Note that the notch 59 may be filled with e.g. the same material as that of the base portion 53, a metal material such as aluminum.

The above described light guide part 5 extends toward the left side in FIG. 6 with respect to the photoelectrical conversion part 4 in the plan view. On the other hand, the heat dissipation portions 331 to 334 respectively extend toward the right side in FIG. 6 with respect to the photoelectrical conversion part 4. As described above, the light guide part 5 is extended in the opposite direction to that of the heat dissipation portions 331 to 334, and thereby, overlap of the light guide part 5 with the heat dissipation portions 331 to 334 may be suppressed, the heat of the heat dissipation portions 331 to 334 is harder to be transferred to the light guide part 5, and the temperature rise of the light guide part 5 may be suppressed. As a result, the light guide part 5 may have stable optical transmission characteristics.

Note that a connector (not shown) is provided in the distal end portion of the light guide part 5 and the part can be connected to the optical interconnection 9 via the connector.

As above, the robot 1 and the optical signal transmitter 2 are explained. As described above, the optical signal transmitter 2 includes the light emitting device 41 (light source), the supporting board 3 that supports the light emitting device 41, and the light guide part 5 that transmits the light emitted from the light emitting device 41. Further, the supporting board 3 has the board main body 31, the penetration portions 321, 322 connected to the light emitting device 41, penetrating in the thickness direction of the board main body 31, and formed using the metal material, and the heat dissipation portions 331, 332 connected to the penetration portions 321, 322 and formed using the metal material. Further, the penetration portions 321, 322 are placed between the light emitting device 41 and the heat dissipation portions 331, 332 and the light emitting device 41 is placed between the light guide part 5 and the supporting board 3. According to the optical signal transmitter 2 having the above described configuration, the heat generated from the light emitting device 41 is transferred to the heat dissipation portions 331, 332 via the penetration portions 321, 322 and released from the heat dissipation portions 331, 332 to outside, and thereby, the temperature rise of the light emitting device 41 may be suppressed and the reduction of the light emission efficiency (light intensity) of the light emitting device 41 due to the temperature rise may be suppressed. Accordingly, the bit error of the first optical signal LS1 may be reduced. Further, according to the configuration, for example, a housing for heat dissipation as that in related art is not necessary and the height of the optical signal transmitter 2 may be reduced.

As described above, the robot 1 has the optical signal transmitters 2 that transmits the optical signal. As described above, the optical signal transmitter 2 includes the light emitting device 41 (light source), the supporting board 3 that supports the light emitting device 41, and the light guide part 5 that transmits the light emitted from the light emitting device 41. Further, the supporting board 3 has the board main body 31, the penetration portions 321, 322 connected to the light emitting device 41, penetrating in the thickness direction of the board main body 31, and formed using the metal material, and the heat dissipation portions 331, 332 connected to the penetration portions 321, 322 and formed using the metal material. Further, the penetration portions 321, 322 are placed between the light emitting device 41 and the heat dissipation portions 331, 332 and the light emitting device 41 is placed between the light guide part 5 and the supporting board 3. According to the robot 1 having the above described configuration, the heat generated from the light emitting device 41 is transferred to the heat dissipation portions 331, 332 via the penetration portions 321, 322 and released from the heat dissipation portions 331, 332 to outside, and thereby, the temperature rise of the light emitting device 41 may be suppressed and the reduction of the light emission efficiency (light intensity) of the light emitting device 41 due to the temperature rise may be suppressed. Accordingly, the bit error of the first optical signal LS1 may be reduced. Further, according to the robot 1 having the above described configuration, for example, a housing for heat dissipation as that in related art is not necessary and the height of the optical signal transmitter 2 may be reduced.

As described above, the supporting board 3 has the concave portion 311 with the bottom, and the light emitting device 41 is placed on the bottom surface 311a of the concave portion 311. As described above, the concave portion 311 is formed in the board main body 31 and the light emitting device 41 is placed within the concave portion 311, and thereby, the height of the optical signal transmitter 2 may be further reduced.

As described above, the penetration portions 321, 322 are placed on the bottom surface 311a of the concave portion 311. Thereby, the lengths of the penetration portions 321, 322 may be made shorter, the transfer efficiency of the heat from the light emitting device 41 to the penetration portions 321, 322 may be improved, and the temperature rise of the light emitting device 41 may be suppressed more effectively.

As described above, the light guide part 5 is connected to the board main body 31. Thereby, the heat dissipation portions 33 may be placed on the lower surface 31b of the board main body 31 without the light guide part getting in the way. Further, the heat dissipation portions 33 may be placed in a wider range, and the heat dissipation properties of the heat dissipation portions 33 may be improved.

As described above, in the plan view of the supporting board 3, the penetration portions 321, 322 overlap with the light emitting device 41. Thereby, the thermal connection between the light emitting device 41 and the penetration portions 321, 322 becomes more reliable and the heat generated from the light emitting device 41 may be transferred to the heat dissipation portions 331, 332 via the penetration portions 321, 322 more efficiently. Note that the penetration portions 321, 322 are not limited to that, but do not necessarily overlap with the light emitting device 41 in the plan view of the supporting board 3.

As described above, the penetration portions 321, 322 are electrically connected to the light emitting device 41. Thereby, the penetration portions 321, 322 and the heat dissipation portions 331, 332 may be used as wires for the light emitting device 41. Accordingly, it is not necessary to provide wires for the light emitting device 41 separately and the optical signal transmitter 2 may be downsized because of the absence of the wires.

As described above, in the plan view of the supporting board 3, the light guide part 5 extends toward one side with respect to the light emitting device 41 and the heat dissipation portions 331, 332 extend toward the other side with respect to the light emitting device 41. Thereby, the overlap of the light guide part 5 with the heat dissipation portions 331, 332 may be suppressed, the heat of the heat dissipation portions 331, 332 is harder to be transferred to the light guide part 5, and the temperature rise of the light guide part 5 may be suppressed. As a result, the light guide part 5 may have stable optical transmission characteristics.

Second Embodiment

Next, an optical signal transmitter according to the second embodiment of the invention will be explained.

Figure 8:
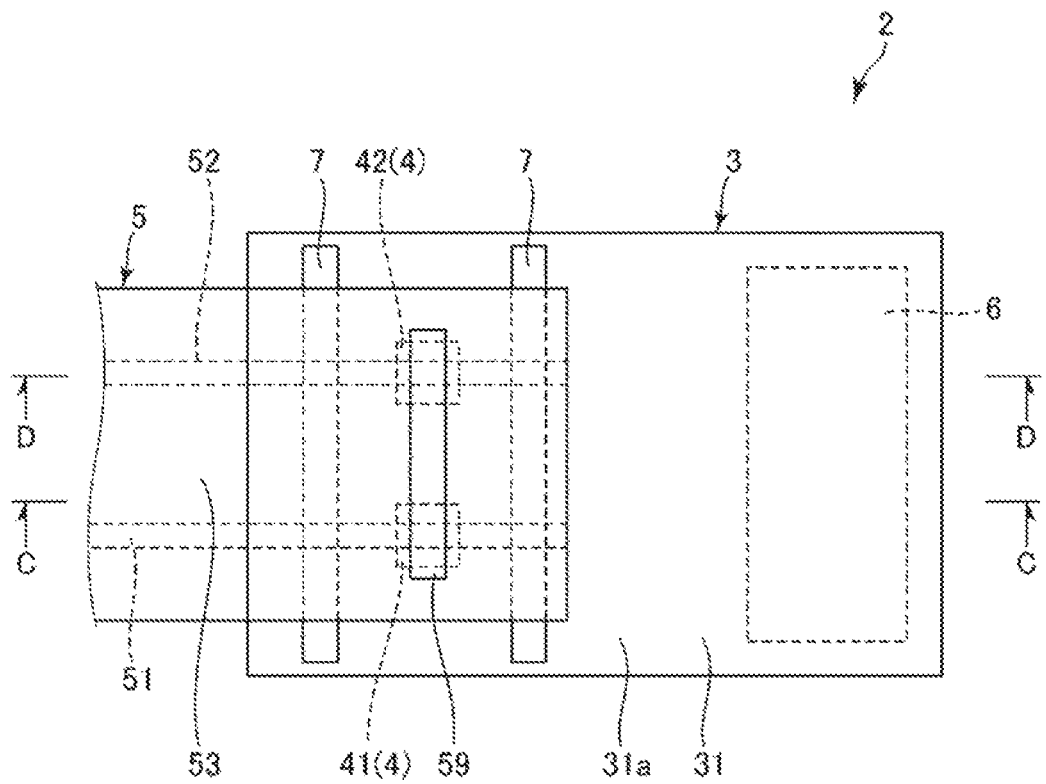
FIG. 8 is a top view showing an optical signal transmitter according to a second embodiment of the invention.
Figure 9:
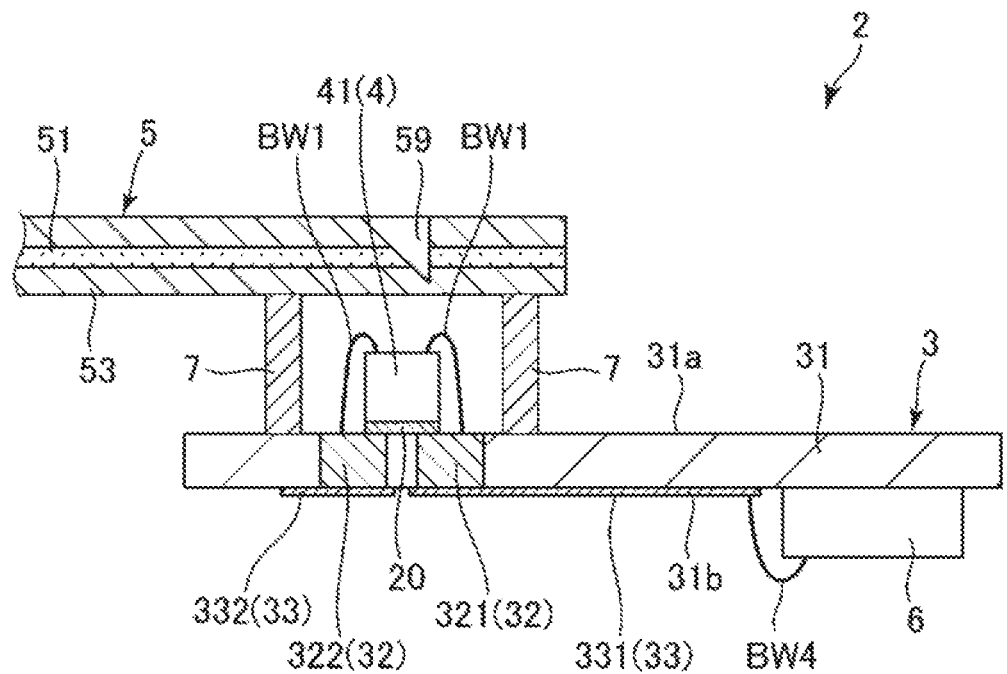
FIG. 9 is a sectional view along line C-C in FIG. 8.
Figure 10:
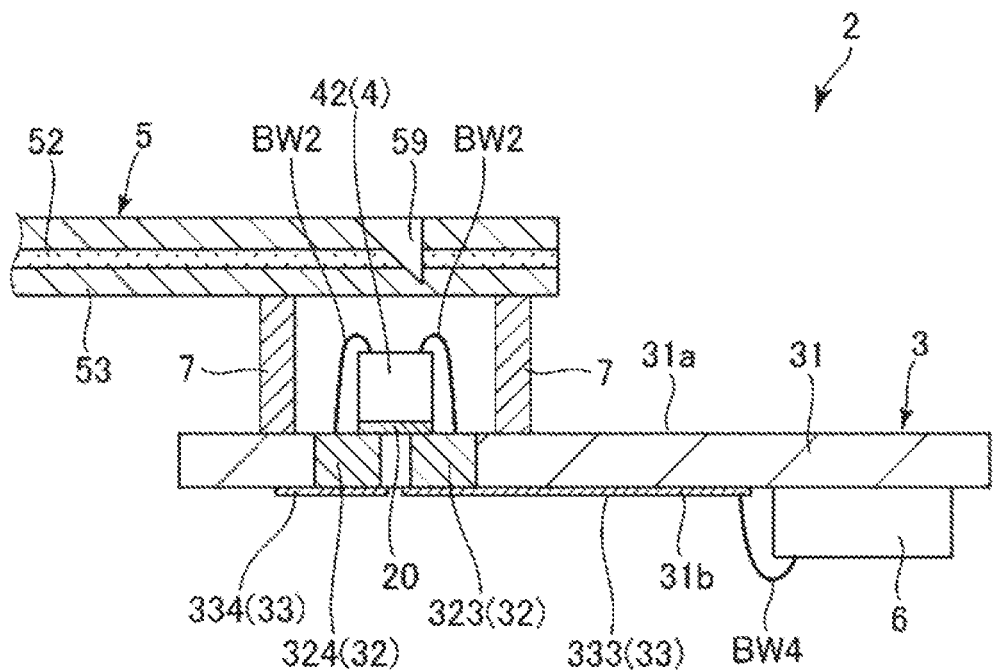
FIG. 10 is a sectional view along line D-D in FIG. 8.
Figure 11:
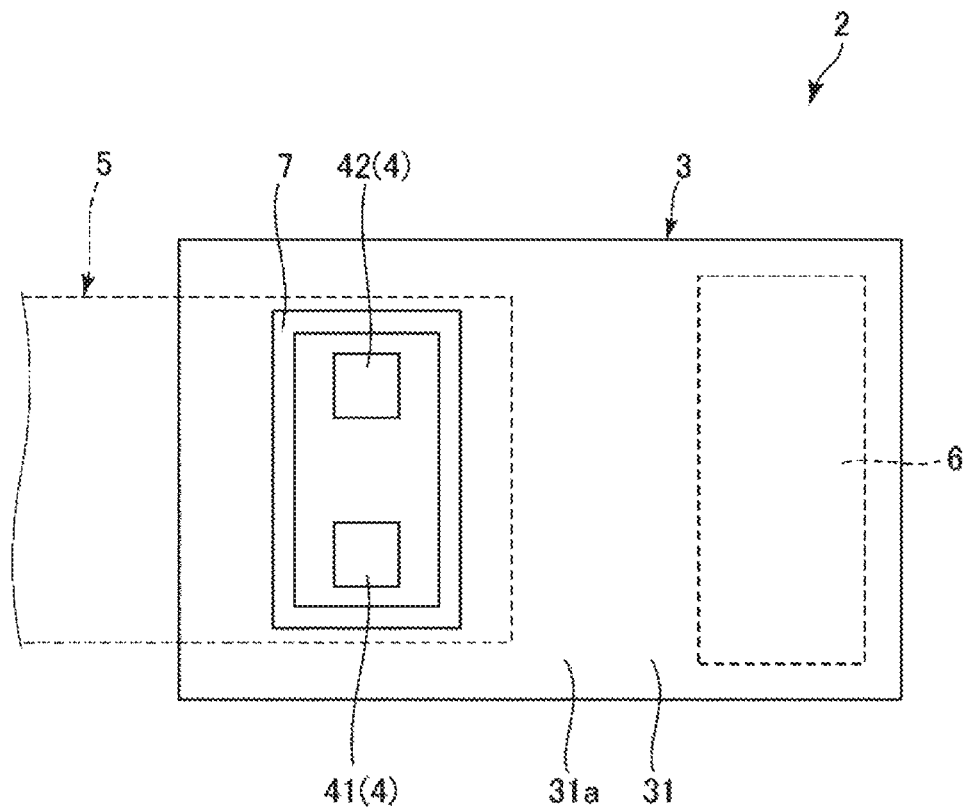
FIG. 11 is a top view showing a modified example of the optical signal transmitter shown in FIG. 8.

FIG. 8 is a top view showing the optical signal transmitter according to the second embodiment of the invention. FIG. 9 is a sectional view along line C-C in FIG. 8. FIG. 10 is a sectional view along line D-D in FIG. 8. FIG. 11 is a top view showing a modified example of the optical signal transmitter shown in FIG. 8.

The embodiment is the same as the above described first embodiment except that the configuration of the optical signal transmitter is different. Note that, in the following description, the embodiment will be explained with a focus on the differences from the above described first embodiment and the explanation of the same items will be omitted. In FIGS. 8 to 11, the same configurations as those of the above described embodiment have the same signs.

As shown in FIGS. 8 to 10, in the optical signal transmitter 2 of the embodiment, the concave portion 311 is omitted from the board main body 31 and the light emitting device 41 and the light receiving device 42 are placed on the upper surface 31a of the board main body 31. Further, the optical signal transmitter 2 has supporting portions 7 located between the board main body 31 and the light guide part 5. The board main body 31 and the light guide part 5 are connected by the supporting portions 7. Thereby, the space for placement of the light emitting device 41 and the light receiving device 42 may be secured between the supporting board 3 and the light guide part 5. Particularly, according to the embodiment, the concave portion 311 may be omitted from the board main body 31 and the configuration of the supporting board 3 may be simpler than that of the above described first embodiment because of the absence of the concave portion 311. Note that the constituent material of the supporting portions 7 is not particularly limited, but various resin materials, various metal materials, various ceramic materials, various glass materials, etc. may be used.

According to the above described second embodiment, the same advantages as those of the above described first embodiment may be offered. Note that, in the embodiment, the pair of supporting portions 7 are provided with the photoelectrical conversion part 4 in between, however, the configuration of the supporting portions 7 is not limited to that. For example, as shown in FIG. 11, a frame shape surrounding the photoelectrical conversion part 4 may be employed. Thereby, the photoelectrical conversion part 4 may be sealed and the photoelectrical conversion part 4 may be protected from dust and moisture.

Third Embodiment

Next, an optical signal transmitter according to the third embodiment of the invention will be explained.

Figure 12:
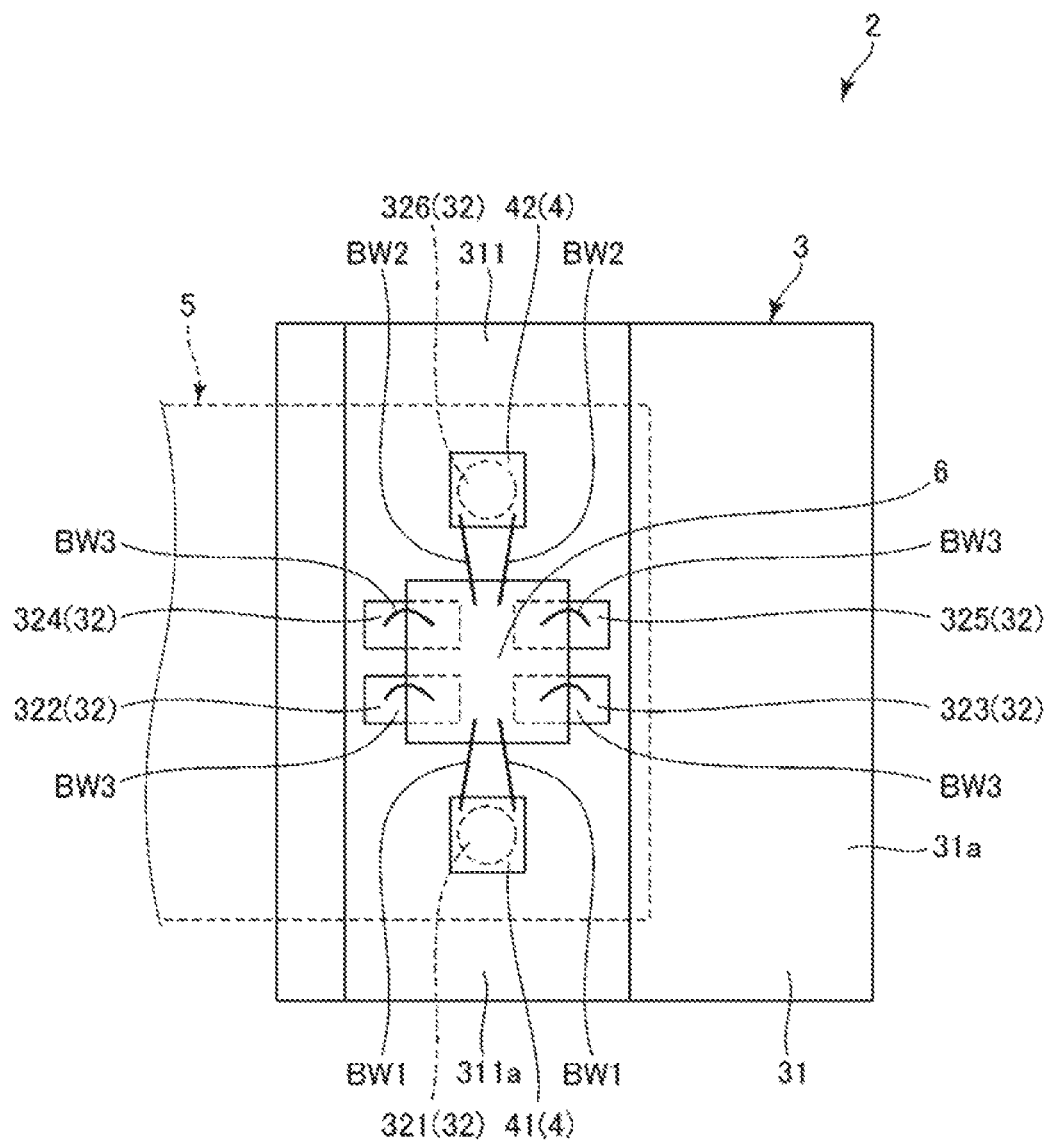
FIG. 12 is a top view showing an optical signal transmitter according to a third embodiment of the invention.
Figure 13:
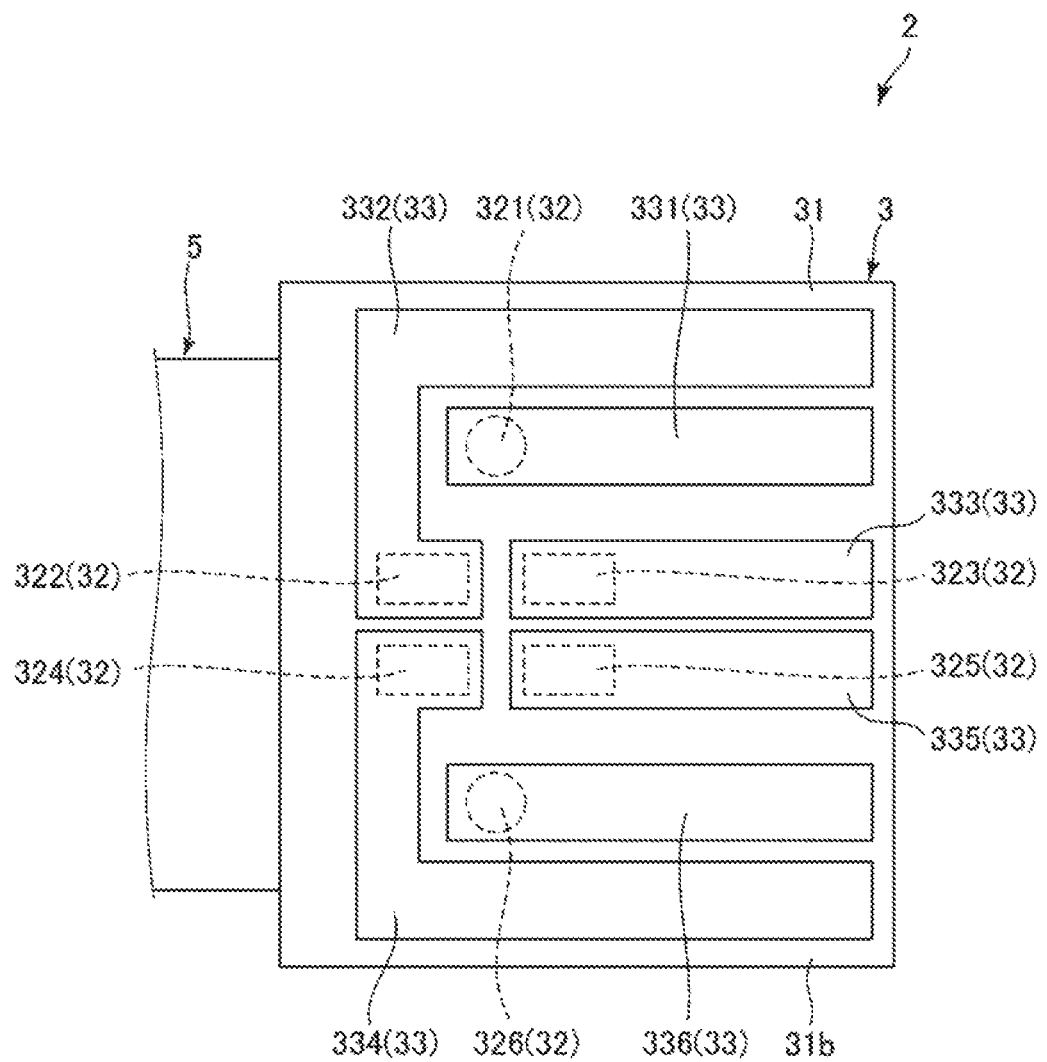
FIG. 13 is a bottom view showing the optical signal transmitter shown in FIG. 12.

FIG. 12 is a top view showing the optical signal transmitter according to the third embodiment of the invention. FIG. 13 is a bottom view showing the optical signal transmitter shown in FIG. 12.

The embodiment is the same as the above described first embodiment except that the configuration of the optical signal transmitter is different. Note that, in the following description, the embodiment will be explained with a focus on the differences from the above described first embodiment and the explanation of the same items will be omitted. In FIGS. 12 and 13, the same configurations as those of the above described embodiments have the same signs.

As shown in FIG. 12, in the optical signal transmitter 2 of the embodiment, the circuit element 6 is placed on the bottom surface 311a of the concave portion 311. Further, the circuit element 6 is placed between the light emitting device 41 and the light receiving device 42, and electrically connected to the light emitting device 41 via the bonding wires BW1 and electrically connected to the light receiving device 42 via the bonding wires BW2. As described above, the circuit element 6 is held within the concave portion 311, and thereby, for example, the height of the optical signal transmitter 2 may be further reduced compared to the above described first embodiment.

As shown in FIGS. 12 and 13, the supporting board 3 has six penetration portions 32 (321, 322, 323, 324, 325, 326) penetrating the board main body 31 in the thickness direction, and six heat dissipation portions 33 (331, 332, 333, 334, 335, 336) provided on the lower surface 31b of the board main body 31. The heat dissipation portion 331 is electrically connected to the penetration portion 321, the heat dissipation portion 332 is electrically connected to the penetration portion 322, the heat dissipation portion 333 is electrically connected to the penetration portion 323, the heat dissipation portion 334 is electrically connected to the penetration portion 324, the heat dissipation portion 335 is electrically connected to the penetration portion 325, and the heat dissipation portion 336 is electrically connected to the penetration portion 326.

Further, as shown in FIG. 12, in the plan view of the supporting board 3, the penetration portion 321 overlaps with the light emitting device 41. Therefore, the heat of the light emitting device 41 is transferred to the heat dissipation portion 331 via the penetration portion 321 and released to outside in the heat dissipation portion 331. Note that the penetration portion 321 is only thermally connected, but not electrically connected to the light emitting device 41.

In the plan view of the supporting board 3, the penetration portion 326 overlaps with the light receiving device 42. Therefore, the heat of the light receiving device 42 is transferred to the heat dissipation portion 336 via the penetration portion 326 and released to outside in the heat dissipation portion 336. Note that the penetration portion 326 is only thermally connected, but not electrically connected to the light receiving device 42.

In the plan view of the supporting board 3, the penetration portions 322 to 325 respectively overlap with the circuit element 6. Therefore, the heat of the circuit element 6 is transferred to the heat dissipation portions 332 to 335 via the penetration portions 322 to 325 and released to outside in the heat dissipation portions 332 to 335. Further, the penetration portions 322 to 325 are respectively electrically connected to the circuit element 6 via bonding wires BW3. Accordingly, the circuit element 6 is electrically led to outside of the concave portion 311 (the lower surface 31b of the board main body 31) via the penetration portions 322 to 325 and the heat dissipation portions 332 to 335. Therefore, the electrical connection between an external apparatus and the circuit element 6 is easier.

According to the above described third embodiment, the same advantages as those of the above described first embodiment may be offered.

Fourth Embodiment

Next, an optical signal transmitter according to the fourth embodiment of the invention will be explained.

Figure 14:
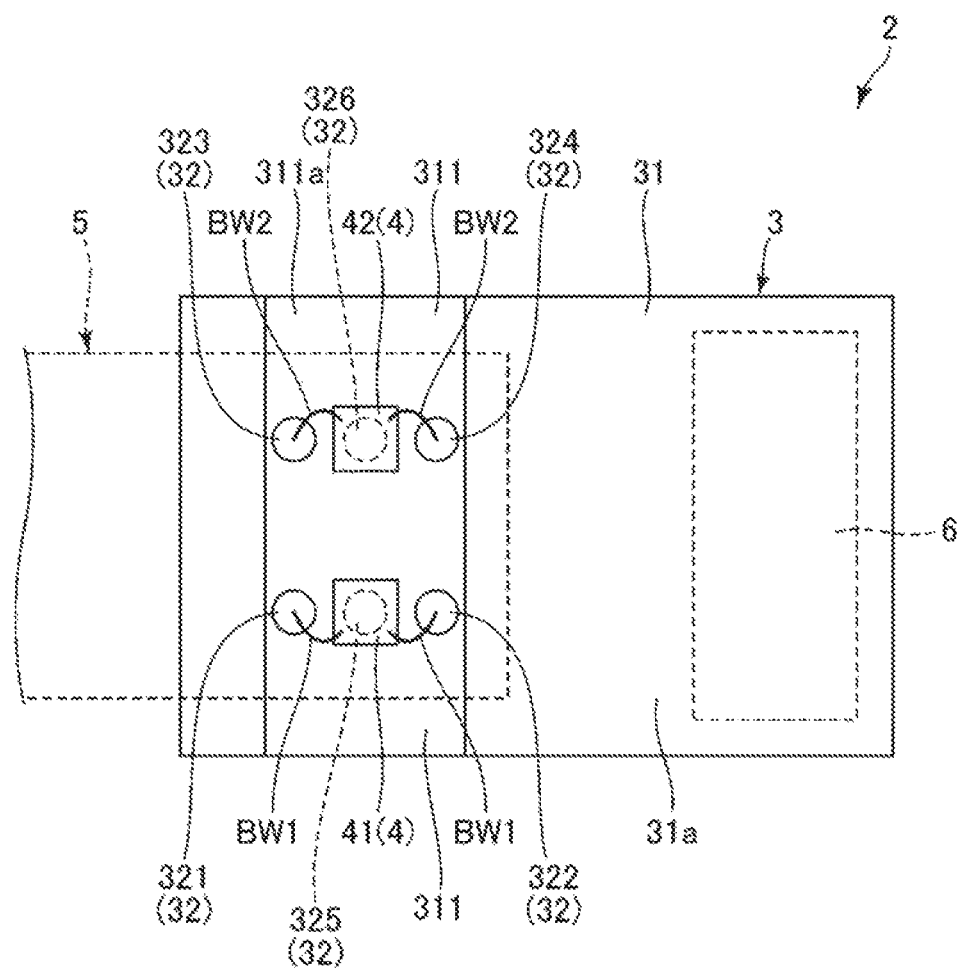
FIG. 14 is a top view showing an optical signal transmitter according to a fourth embodiment of the invention.
Figure 15:
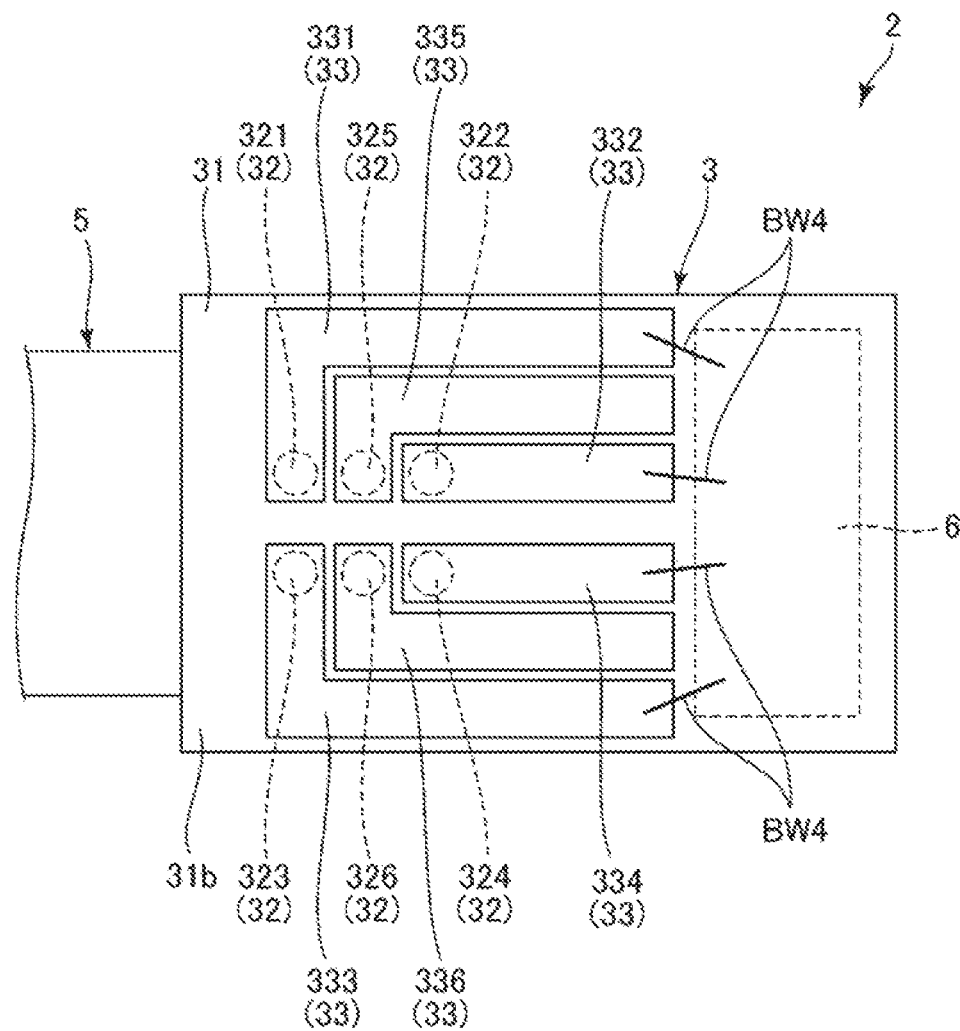
FIG. 15 is a bottom view showing the optical signal transmitter shown in FIG. 14.

FIG. 14 is a top view showing the optical signal transmitter according to the fourth embodiment of the invention. FIG. 15 is a bottom view showing the optical signal transmitter shown in FIG. 14.

The embodiment is the same as the above described first embodiment except that the configuration of the optical signal transmitter is different. Note that, in the following description, the embodiment will be explained with a focus on the differences from the above described first embodiment and the explanation of the same items will be omitted. In FIGS. 14 and 15, the same configurations as those of the above described embodiments have the same signs.

As shown in FIGS. 14 and 15, in the optical signal transmitter 2 of the embodiment, the supporting board 3 has six penetration portions 32 (321, 322, 323, 324, 325, 326) penetrating the board main body 31, and six heat dissipation portions 33 (331, 332, 333, 334, 335, 336) provided on the lower surface 31b of the board main body 31. The heat dissipation portion 331 is electrically connected to the penetration portion 321, the heat dissipation portion 332 is electrically connected to the penetration portion 322, the heat dissipation portion 333 is electrically connected to the penetration portion 323, the heat dissipation portion 334 is electrically connected to the penetration portion 324, the heat dissipation portion 335 is electrically connected to the penetration portion 325, and the heat dissipation portion 336 is electrically connected to the penetration portion 326.

Further, as shown in FIG. 14, in the plan view of the supporting board 3, the penetration portion 325 overlaps with the light emitting device 41. Therefore, the heat of the light emitting device 41 is transferred to the heat dissipation portion 335 via the penetration portion 325 and released to outside in the heat dissipation portion 335. Note that the penetration portion 325 is only thermally connected, but not electrically connected to the light emitting device 41.

In the plan view of the supporting board 3, the penetration portions 321, 322 are provided around the light emitting device 41 not to overlap with the light emitting device 41. The light emitting device 41 and the penetration portions 321, 322 are electrically connected via the bonding wires BW1. Thereby, the light emitting device 41 and the circuit element 6 may be electrically connected via the penetration portions 321, 322 and the heat dissipation portions 331, 332. The heat of the light emitting device 41 is transferred to the heat dissipation portions 331, 332 via the bonding wires BW1 and the penetration portions 321, 322 and released to outside in the heat dissipation portions 331, 332.

As described above, in the embodiment, the heat of the light emitting device 41 may be released to outside by the heat dissipation portions 331, 332, 335, and thereby, the excessive temperature rise of the light emitting device 41 may be suppressed more effectively.

In the plan view of the supporting board 3, the penetration portion 326 overlaps with the light receiving device 42. Therefore, the heat of the light receiving device 42 is transferred to the heat dissipation portion 336 via the penetration portion 326 and released to outside in the heat dissipation portion 336. Note that the penetration portion 326 is only thermally connected, but not electrically connected to the light receiving device 42.

In the plan view of the supporting board 3, the penetration portions 323, 324 are provided around the light receiving device 42 not to overlap with the light receiving device 42. The light receiving device 42 and the penetration portions 323, 324 are electrically connected via the bonding wires BW2. Thereby, the light receiving device 42 and the circuit element 6 may be electrically connected via the penetration portions 323, 324 and the heat dissipation portions 333, 334. The heat of the light receiving device 42 is transferred to the heat dissipation portions 333, 334 via the bonding wires BW2 and the penetration portions 323, 324 and released to outside in the heat dissipation portions 333, 334.

As described above, in the embodiment, the heat of the light receiving device 42 may be released to outside by the heat dissipation portions 333, 334, 336, and thereby, the excessive temperature rise of the light receiving device 42 may be suppressed more effectively.

According to the above described fourth embodiment, the same advantages as those of the above described first embodiment may be offered.

Fifth Embodiment

Next, a printer according to the fifth embodiment of the invention will be explained.

Figure 16:
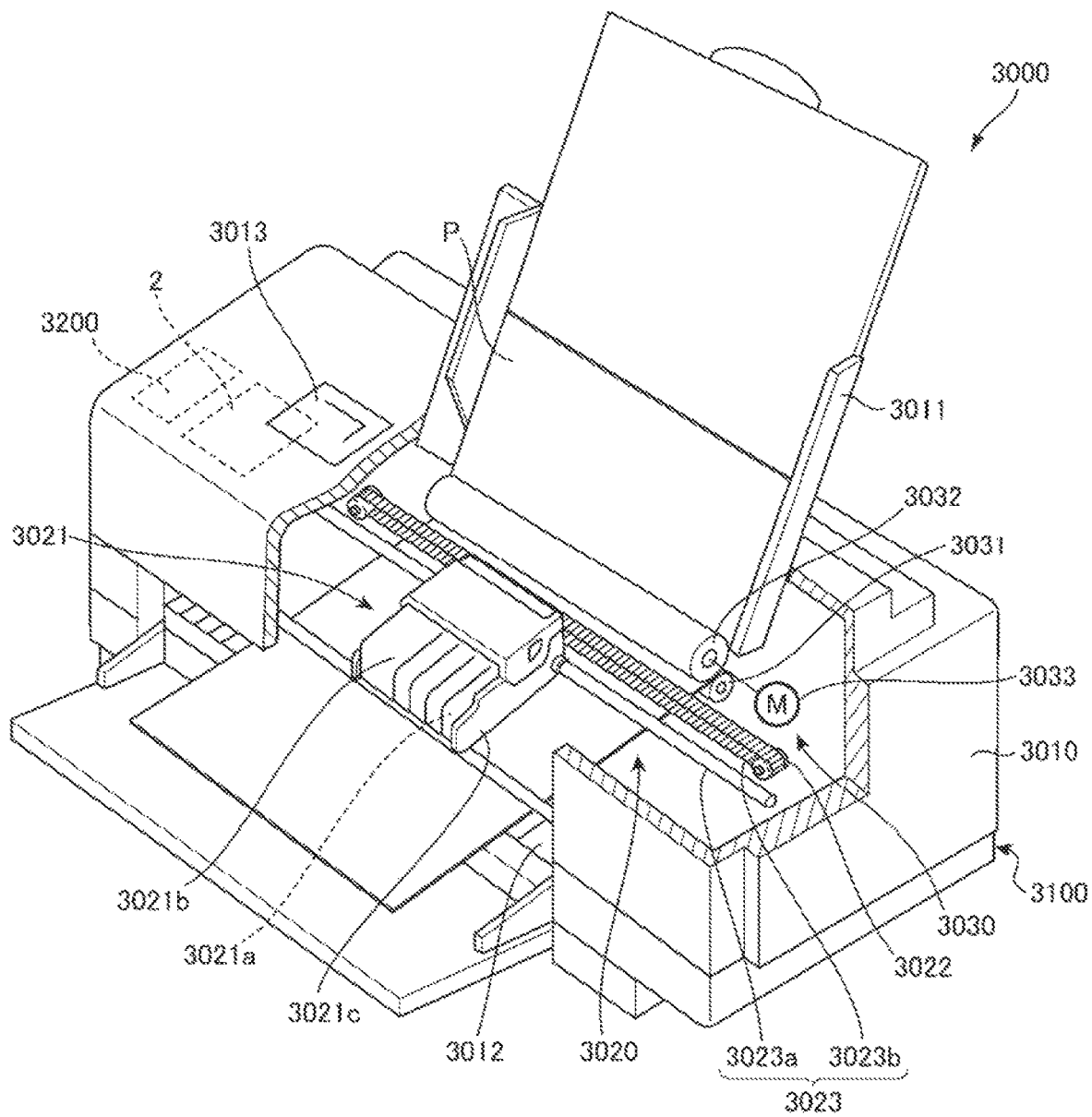
FIG. 16 is a schematic diagram showing an overall configuration of a printer according to a fifth embodiment of the invention.
Figure 17:
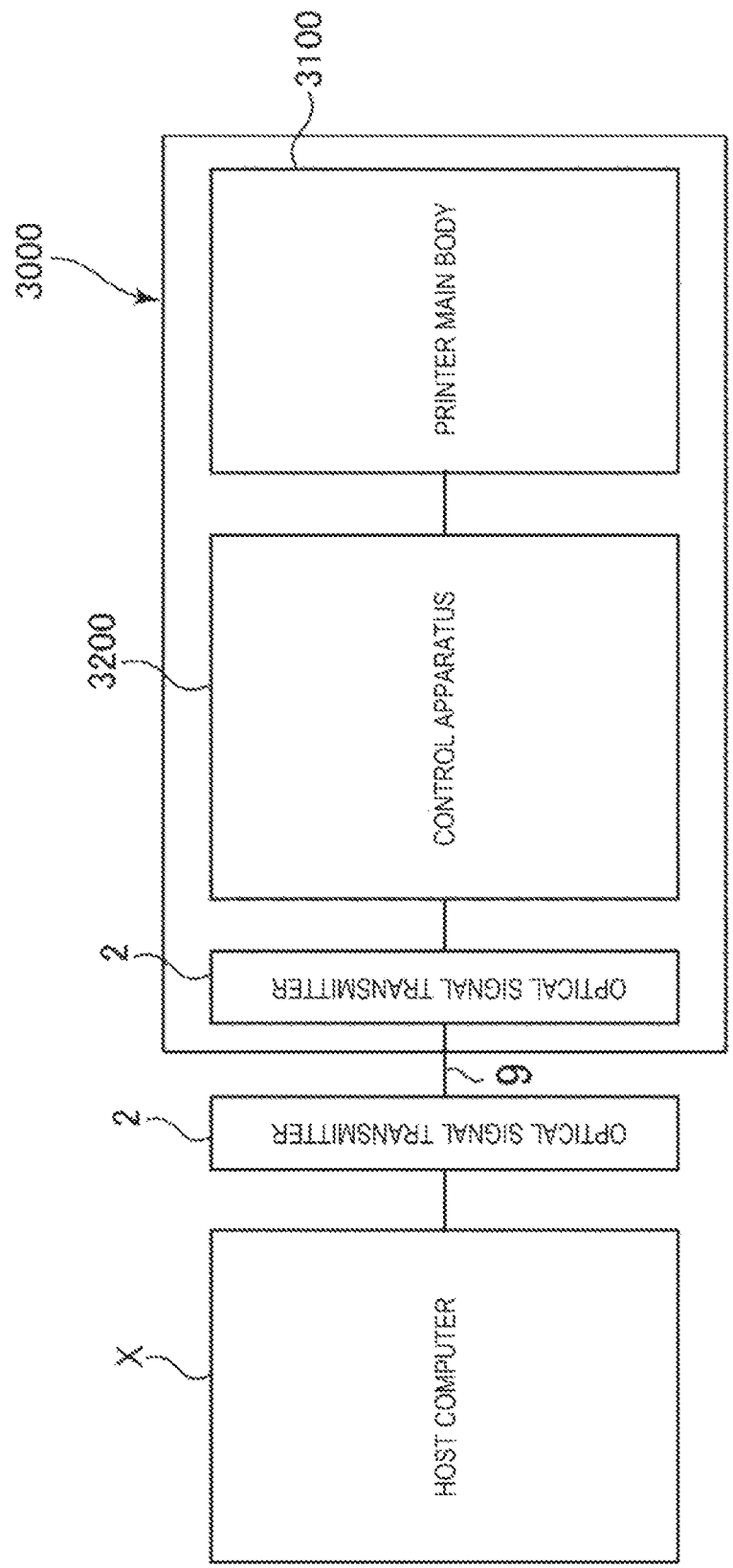
FIG. 17 is a block diagram showing a control apparatus of the printer shown in FIG. 16.

FIG. 16 is a schematic diagram showing an overall configuration of the printer according to the fifth embodiment of the invention. FIG. 17 is a block diagram showing a control apparatus of the printer shown in FIG. 16.

A printer 3000 shown in FIG. 16 includes a printer main body 3100 having a housing 3010 and a printing mechanism 3020 and a paper feed mechanism 3030 provided inside of the housing 3010, and a control apparatus 3200 that controls driving of the printer main body 3100. In the housing 3010, a tray 3011 in which recording paper P is placed, a paper eject opening 3012 through which the recording paper P is ejected, and an operation panel 3013 including a liquid crystal display are provided.

The printing mechanism 3020 includes a head unit 3021, a carriage motor 3022, and a reciprocation mechanism 3023 that reciprocates the head unit 3021 by drive power of the carriage motor 3022. Further, the head unit 3021 has a head 3021a as an inkjet recording head, an ink cartridge 3021b that supplies ink to the head 3021a, and a carriage 3021c on which the head 3021a and the ink cartridge 3021b are mounted.

The reciprocation mechanism 3023 has a carriage guide shaft 3023a that reciprocably supports the carriage 3021c and a timing belt 3023b that moves the carriage 3021c on the carriage guide shaft 3023a by drive power of the carriage motor 3022. Further, the paper feed mechanism 3030 has a driven roller 3031 and a drive roller 3032 in press contact with each other, and a motor 3033 that drives the drive roller 3032.

In the printer main body 3100, the paper feed mechanism 3030 intermittently feeds the recording paper P one by one to the vicinity of the lower part of the head unit 3021. Concurrently, the head unit 3021 reciprocates in directions nearly orthogonal to the feed direction of the recording paper P, and printing on the recording paper P is performed.

The control apparatus 3200 is a personal computer or the like and controls driving of the respective parts of the printer main body 3100. For example, the control is executed based on print data input from a host computer X such as a personal computer.

Further, as shown in FIG. 17, the printer 3000 has the optical signal transmitter 2 electrically connected to the control apparatus 3200 and communicates with the host computer X via the optical signal transmitter 2. Note that the optical signal transmitter 2 may have the same configuration as the optical signal transmitter 2 explained in one of the above described first embodiment to fourth embodiment.

As described above, the printer 3000 has the optical signal transmitter 2 that transmits an optical signal. Further, as described above, the optical signal transmitter 2 includes the light emitting device 41 (light source), the supporting board 3 that supports the light emitting device 41, and the light guide part 5 that transmits the light emitted from the light emitting device 41. The supporting board 3 has the board main body 31, the penetration portions 321, 322 connected to the light emitting device 41, penetrating in the thickness direction of the board main body 31, and formed using the metal material, and the heat dissipation portions 331, 332 connected to the penetration portions 321, 322 and formed using the metal material. Further, the penetration portions 321, 322 are placed between the light emitting device 41 and the heat dissipation portions 331, 332 and the light emitting device 41 is placed between the light guide part 5 and the supporting board 3. According to the printer 3000 having the above described configuration, the heat generated from the light emitting device 41 is transferred to the heat dissipation portions 331, 332 via the penetration portions 321, 322 and released from the heat dissipation portions 331, 332 to outside, and thereby, the temperature rise of the light emitting device 41 may be suppressed and the reduction of the light emission efficiency (light intensity) of the light emitting device 41 due to the temperature rise may be suppressed. Accordingly, the bit error of the first optical signal LS1 may be reduced. Further, according to the printer 3000 having the above described configuration, for example, a housing for heat dissipation as that in related art is not necessary and the height of the optical signal transmitter 2 may be reduced.

As above, the robot, printer, and optical signal transmitter according to the invention are explained based on the illustrated embodiments, however, the invention is not limited to those. The configurations of the respective parts may be replaced by arbitrary configurations having the same functions. Further, other arbitrary configurations may be added to the invention. Furthermore, the above described respective embodiments may be appropriately combined.

In the above described embodiments, the configurations in which the robots are the six-axis robots are explained.

However, the robots are not particularly limited, but may be e.g. dual-arm robots, scalar robots, handlers, or the like.

The entire disclosure of Japanese Patent Application No. 2018-022830, filed Feb. 13, 2018 is expressly incorporated by reference herein.

What is claimed is:

1. A robot comprising an optical signal transmitter that transmits an optical signal,
    the optical signal transmitter including:
        a light source;
        a supporting board that supports the light source; and
        a light guide part that transmits light emitted from the light source,
    wherein the supporting board includes a board main body, a penetration portion connected to the light source, penetrating in a thickness direction of the board main body, and formed using a metal material, and a heat dissipation portion connected to the penetration portion and formed using a metal material,
    the penetration portion is placed between the light source and the heat dissipation portion, and
    the light source is placed between the light guide part and the supporting board.

2. The robot according to claim 1, wherein the supporting board includes a concave portion with a bottom, and the light source is placed on a bottom surface of the concave portion.

3. The robot according to claim 2, wherein the penetration portion is placed on the bottom surface of the concave portion.

4. The robot according to claim 2, wherein the light guide part is connected to the board main body.

5. The robot according to claim 1, further comprising a supporting portion located between the board main body and the light guide part,
    wherein the board main body and the light guide part are connected via the supporting portion.

6. The robot according to claim 1, wherein, in the plan view of the supporting board, the penetration portion overlaps with the light source.

7. The robot according to claim 1, wherein the penetration portion is electrically connected to the light source.

8. The robot according to claim 1, wherein, in the plan view of the supporting board, the light guide part extends toward one side with respect to the light source and the heat dissipation portion extends toward the other side with respect to the light source.

9. A printer comprising an optical signal transmitter that transmits an optical signal,
    the optical signal transmitter including:
        a light source;
        a supporting board that supports the light source; and
        a light guide part that transmits light emitted from the light source,
    wherein the supporting board includes a board main body, a penetration portion connected to the light source, penetrating in a thickness direction of the board main body, and formed using a metal material, and a heat dissipation portion connected to the penetration portion and formed using a metal material,
    the penetration portion is placed between the light source and the heat dissipation portion, and
    the light source is placed between the light guide part and the supporting board.

10. An optical signal transmitter comprising:
    a light source;
    a supporting board that supports the light source; and
    a light guide part that transmits light emitted from the light source,
    wherein the supporting board includes a board main body, a penetration portion connected to the light source, penetrating in a thickness direction of the board main body, and formed using a metal material, and a heat dissipation portion connected to the penetration portion and formed using a metal material,
    the penetration portion is placed between the light source and the heat dissipation portion, and
    the light source is placed between the light guide part and the supporting board.

* * * * *